(12) United States Patent
Takami et al.

(10) Patent No.: US 10,196,545 B2
(45) Date of Patent: Feb. 5, 2019

(54) SHIELDING FILM AND SHIELDED PRINTED WIRING BOARD

(71) Applicant: TATSUTA ELECTRIC WIRE & CABLE CO., LTD., Higashiosaka-shi, Osaka (JP)

(72) Inventors: Kouji Takami, Higashiosaka (JP); Yoshihisa Yamamoto, Higashiosaka (JP); Kenji Kamino, Higashiosaka (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 15/572,778

(22) PCT Filed: May 23, 2016

(86) PCT No.: PCT/JP2016/065178
§ 371 (c)(1),
(2) Date: Nov. 8, 2017

(87) PCT Pub. No.: WO2016/190278
PCT Pub. Date: Dec. 1, 2016

(65) Prior Publication Data
US 2018/0134920 A1     May 17, 2018

(30) Foreign Application Priority Data
May 26, 2015 (JP) .................................. 2015-106549

(51) Int. Cl.
*B32B 3/00*     (2006.01)
*C09J 7/30*     (2018.01)
(Continued)

(52) U.S. Cl.
CPC *C09J 7/30* (2018.01); *B32B 7/12* (2013.01); *B32B 15/04* (2013.01); *B32B 15/08* (2013.01);
(Continued)

(58) Field of Classification Search
CPC .... C09J 7/28; C09J 7/30; C09J 163/00; B32B 7/12; B32B 15/04; B32B 15/08;
(Continued)

(56) References Cited

U.S. PATENT DOCUMENTS 10,015,915 B2    7/2018  Tajima et al.
10,051,765 B2    8/2018  Tajima et al.
(Continued)

FOREIGN PATENT DOCUMENTS

JP    2007-294918       11/2007
JP    2014-141603 A      8/2014
(Continued)

OTHER PUBLICATIONS

International Search Report issued in connection with PCT/JP2016/065178.
Written Opinion issued in connection with PCT/JP2016/065178.

*Primary Examiner* — Elizabeth E Mulvaney
(74) *Attorney, Agent, or Firm* — Potomac Law Group, PLLC; Kenneth Fagin

(57) ABSTRACT

There is provided a shielding film that simultaneously satisfies excellent high-speed transmission characteristics and excellent flame retardancy. A shielding film according to the present invention includes: a metal layer; and a conductive adhesive layer arranged on one side of the metal layer. The conductive adhesive layer contains a cured product of an epoxy resin and a carboxyl group-containing elastomer, an organic phosphorus-based flame retardant, and a conductive filler; the metal layer has a thickness of from 0.3 μm to 7 μm; and a conductive adhesive forming the conductive adhesive layer contains 10 parts by weight to 50 parts by weight of the organic phosphorus-based flame retardant and 10 parts by weight to 80 parts by weight of the conductive (Continued)

filler with respect to 100 parts by weight of a total of the epoxy resin and the carboxyl group-containing elastomer.

6 Claims, 3 Drawing Sheets

(51) Int. Cl.

| | |
|---|---|
| *B32B 15/08* | (2006.01) |
| *B32B 15/092* | (2006.01) |
| *H05K 1/02* | (2006.01) |
| *C09J 7/28* | (2018.01) |
| *B32B 7/12* | (2006.01) |
| *B32B 15/04* | (2006.01) |
| *C09J 9/02* | (2006.01) |
| *C09J 153/00* | (2006.01) |
| *C09J 163/00* | (2006.01) |
| *H05K 9/00* | (2006.01) |
| *C08K 3/32* | (2006.01) |

(52) U.S. Cl.
CPC ............... *B32B 15/092* (2013.01); *C09J 7/28* (2018.01); *C09J 9/02* (2013.01); *C09J 153/00* (2013.01); *C09J 163/00* (2013.01); *H05K 1/02* (2013.01); *H05K 1/0216* (2013.01); *H05K 9/0086* (2013.01); *B32B 2255/06* (2013.01); *B32B 2255/26* (2013.01); *B32B 2307/212* (2013.01); *B32B 2457/08* (2013.01); *C08K 3/32* (2013.01); *C08K 2201/001* (2013.01); *C09J 2201/602* (2013.01); *C09J 2201/622* (2013.01); *C09J 2203/326* (2013.01); *C09J 2205/102* (2013.01); *C09J 2400/163* (2013.01); *C09J 2453/00* (2013.01); *C09J 2463/00* (2013.01)

(58) Field of Classification Search
CPC ...... B32B 15/092; H05K 1/02; H05K 1/0216; H05K 9/00
See application file for complete search history.

(56) References Cited

U.S. PATENT DOCUMENTS

| | | |
|---|---|---|
| 2014/0326484 A1 | 11/2014 | Tajima et al. |
| 2016/0205817 A1 | 7/2016 | Tajima et al. |
| 2016/0222192 A1 | 8/2016 | Takashima et al. |

FOREIGN PATENT DOCUMENTS

| | | |
|---|---|---|
| JP | 2014-167956 A | 9/2014 |
| JP | 5861790 B1 | 9/2016 |
| KR | 20140099258 A | 8/2014 |
| TW | 201437305 A | 10/2014 |
| WO | WO 2013/077108 | 5/2013 |
| WO | WO 2014/024678 | 2/2014 |
| WO | WO 2014/147903 | 9/2014 |
| WO | WO 2015/041085 | 9/2014 |
| WO | WO 2016/190278 | 3/2018 |

SHIELDING FILM AND SHIELDED PRINTED WIRING BOARD

TECHNICAL FIELD

The present invention relates to a shielding film and a shielded printed wiring board.

BACKGROUND ART

It has been known that an electromagnetic shielding film (sometimes simply referred to as "shielding film") is arranged on the surface of a flexible printed wiring board for shielding an electromagnetic noise generated from the printed wiring board or an electromagnetic noise from the outside.

In recent years, along with an increase in transmission speed of a portable electronic device, a material to be used in a printed wiring board has started to be required to have excellent high-speed transmission characteristics, more specifically, characteristics such as a low specific dielectric constant and a low dielectric loss tangent. As a result, the shielding film has also been required to have such excellent high-speed transmission characteristics. Meanwhile, the shielding film is often required to have flame retardancy. The use of a non-halogen-based flame retardant in a conductive adhesive to be used in the shielding film has been known as a technology for the impartment of flame retardancy to the shielding film (Patent Literature 1). However, the shielding film having imparted thereto flame retardancy involves a problem in that its specific dielectric constant and dielectric loss tangent are not enough to satisfy levels required by the increase in transmission speed.

As described above, a shielding film that simultaneously satisfies excellent high-speed transmission characteristics and excellent flame retardancy has been strongly required.

CITATION LIST

Patent Literature

[PTL 1] JP 2007-294918 A

SUMMARY OF INVENTION

Technical Problem

The present invention has been made to solve the above-mentioned conventional problems, and an object of the present invention is to provide a shielding film that simultaneously satisfies excellent high-speed transmission characteristics and excellent flame retardancy.

A shielding film according to an embodiment of the present invention includes: a metal layer; and a conductive adhesive layer arranged on one side of the metal layer. The conductive adhesive layer contains a cured product of an epoxy resin and a carboxyl group-containing elastomer, an organic phosphorus-based flame retardant, and a conductive filler; the metal layer has a thickness of from 0.3 µm to 7 µm; and a conductive adhesive forming the conductive adhesive layer contains 10 parts by weight to 50 parts by weight of the organic phosphorus-based flame retardant and 10 parts by weight to 80 parts by weight of the conductive filler with respect to 100 parts by weight of a total of the epoxy resin and the carboxyl group-containing elastomer.

In one embodiment of the present invention, the carboxyl group-containing elastomer includes a styrene-ethylene-propylene-styrene copolymer modified with an unsaturated carboxylic acid.

In another embodiment of the present invention, the organic phosphorus-based flame retardant includes a metal phosphinate.

In still another embodiment of the present invention, the conductive adhesive layer has flame retardancy equal to or better than VTM-0, and has a specific dielectric constant of from 2.0 to 4.0 and a dielectric loss tangent of from 0.0015 to 0.0040 at 1 GHz.

According to another aspect of the present invention, there is provided a shielded printed wiring board. The shielded printed wiring board includes the shielding film as described above.

Advantageous Effects of Invention

According to the embodiment of the present invention, a specific curable resin (as a result, a cured product thereof) and an organic phosphorus-based flame retardant are used in combination in the conductive adhesive layer of the shielding film, and hence the shielding film that simultaneously satisfies excellent high-speed transmission characteristics (typically a low specific dielectric constant and a low dielectric loss tangent) and excellent flame retardancy can be obtained.

DESCRIPTION OF EMBODIMENTS

Specific embodiments of the present invention are described below. However, the present invention is not limited to these embodiments.

A. Overall Construction of Shielding Film

Figure 1:
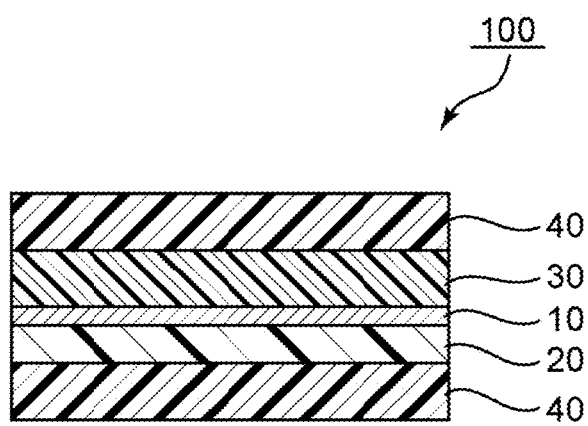
FIG. 1 is a schematic sectional view of a shielding film according to one embodiment of the present invention.

FIG. 1 is a schematic sectional view of a shielding film according to one embodiment of the present invention. A shielding film 100 of this embodiment includes a metal layer 10 and a conductive adhesive layer 20 arranged on one side of the metal layer 10. The shielding film 100 may further include a protective layer 30 arranged on the side of the metal layer 10 opposite to the conductive adhesive layer 20 as required. Practically, a release film (separator) 40 is temporarily bonded to the outside of the metal layer 10 (the protective layer 30 if present) and/or the outside of the conductive adhesive layer 20 in a peelable manner to protect the shielding film until the shielding film is used.

B. Metal Layer

The metal layer 10 is a layer formed of a metal thin film. The metal layer 10 can function as an electromagnetic shielding layer.

Examples of a metal material forming the metal layer include aluminum, silver, copper, gold, nickel, tin, palladium, chromium, titanium, and zinc, and an alloy containing two or more of these metals. The metal material may be appropriately selected in accordance with a desired shielding characteristic.

In one embodiment, a metal foil may be used as the metal layer. In this embodiment, the metal layer may be formed into any appropriate thickness by rolling. In another embodiment, the metal layer may be formed by any appropriate method. Specific examples of the formation method include physical vapor deposition (e.g., vacuum deposition, sputtering, or ion beam deposition), chemical vapor deposition (CVD), and plating. Of those, physical vapor deposition is preferred. This is because the thickness of the layer can be reduced, and even when the thickness is small, excellent conductivity can be imparted to the layer in its plane direction and the layer can be simply formed by a dry process. In this embodiment, when the protective layer to be described later is arranged on the shielding film, the protective layer may be formed on the metal layer by a coating method.

The thickness of the metal layer is preferably 7 μm or less, more preferably from 0.3 μm to 7 μm, still more preferably from 1 μm to 6 μm, particularly preferably from 2 μm to 6 μm. When the thickness of the metal layer is 7 μm or less, a lightweight and thin shielding film can be economically produced. In addition, when the thickness of the metal layer is 0.3 μm or more, transmission characteristics to be described later are improved. When the thickness of the metal layer falls within such range, both excellent high-speed transmission characteristics and excellent flame retardancy can be achieved in a shielding film to be obtained by a synergistic effect with an effect of the conductive adhesive layer to be described later.

The surface resistance of the metal layer is preferably from $0.001\Omega$ to $1\Omega$, more preferably from $0.001\Omega$ to $0.1\Omega$. When the surface resistance of the metal layer falls within such range, the thickness of the metal layer can be set to the above-mentioned desired value while the shielding characteristic of the metal layer is maintained.

C. Conductive Adhesive Layer

The conductive adhesive layer 20 contains a cured product of an epoxy resin and a carboxyl group-containing elastomer, an organic phosphorus-based flame retardant, and a conductive filler. In other words, the conductive adhesive layer 20 is formed by curing a conductive adhesive composition containing a resin component containing the epoxy resin and the carboxyl group-containing elastomer, the organic phosphorus-based flame retardant, and the conductive filler.

As described above, the conductive adhesive composition contains the resin component containing the epoxy resin and the carboxyl group-containing elastomer, the organic phosphorus-based flame retardant, and the conductive filler.

Specific examples of the epoxy resin include: a bisphenol A-type epoxy resin, a bisphenol F-type epoxy resin, and hydrogenated products thereof; glycidyl ester-based epoxy resins, such as o-phthalic acid diglycidyl ester, isophthalic acid diglycidyl ester, terephthalic acid diglycidyl ester, p-hydroxybenzoic acid glycidyl ester, tetrahydrophthalic acid diglycidyl ester, succinic acid diglycidyl ester, adipic acid diglycidyl ester, sebacic acid diglycidyl ester, and trimellitic acid triglycidyl ester; glycidyl ether-based epoxy resins, such as ethylene glycol diglycidyl ether, propylene glycol diglycidyl ether, 1,4-butanediol diglycidyl ether, 1,6-hexanediol diglycidyl ether, trimethylolpropane triglycidyl ether, pentaerythritol tetraglycidyl ether, tetraphenyl glycidyl ether ethane, triphenyl glycidyl ether ethane, polyglycidyl ether of sorbitol, and polyglycidyl ether of polyglycerol; glycidyl amine-based epoxy resins, such as triglycidyl isocyanurate and tetraglycidyldiaminodiphenylmethane; and linear aliphatic epoxy resins, such as epoxidized polybutadiene and epoxidized soybean oil. In addition, novolac-type epoxy resins, such as a phenol novolac epoxy resin, an o-cresol novolac epoxy resin, and a bisphenol A novolac epoxy resin may each be used. Further, a brominated bisphenol A-type epoxy resin, a phosphorus-containing epoxy resin, an epoxy resin having a dicyclopentadiene skeleton, an epoxy resin having a naphthalene skeleton, an anthracene-type epoxy resin, a tert-butylcatechol-type epoxy resin, a triphenylmethane-type epoxy resin, a tetraphenylethane-type epoxy resin, a biphenyl-type epoxy resin, a bisphenol S-type epoxy resin, and the like may each be used.

The epoxy resin preferably has two or more epoxy groups in a molecule thereof. This is because the resin reacts with the carboxyl group-containing styrene-based elastomer to form a cross-linked structure, and hence high heat resistance can be expressed.

The carboxyl group-containing styrene-based elastomer may be used for imparting desired dielectric characteristics (as a result, high-speed transmission characteristics) to the cured product (i.e., the conductive adhesive layer). The carboxyl group-containing styrene-based elastomer is typically obtained by modifying a copolymer mainly formed of block and random structures of a conjugated diene compound and an aromatic vinyl compound, and a hydrogenated product thereof with an unsaturated carboxylic acid. Examples of the aromatic vinyl compound include styrene, t-butylstyrene, α-methylstyrene, p-methylstyrene, divinylbenzene, 1,1-diphenylstyrene, N,N-diethyl-p-aminoethylstyrene, vinyltoluene, and p-tert-butylstyrene. In addition, examples of the conjugated diene compound may include butadiene, isoprene, 1,3-pentadiene, and 2,3-dimethyl-1,3-butadiene.

The modification of the carboxyl group-containing styrene-based elastomer may be performed by, for example, copolymerizing the unsaturated carboxylic acid at the time of the polymerization of the styrene-based elastomer. In addition, the modification may be performed by heating and kneading the styrene-based elastomer and the unsaturated carboxylic acid in the presence of an organic peroxide. Examples of the unsaturated carboxylic acid include acrylic acid, methacrylic acid, maleic acid, itaconic acid, fumaric acid, maleic anhydride, itaconic anhydride, and fumaric anhydride. The amount of the modification with the unsaturated carboxylic acid is, for example, from 0.1 wt % to 10 wt %.

Specific examples of the carboxyl group-containing styrene-based elastomer include products obtained by modifying a styrene-butadiene block copolymer, a styrene-ethylene propylene block copolymer, a styrene-butadiene-styrene block copolymer, a styrene-isoprene-styrene block copolymer, a styrene-ethylene-butylene-styrene block copolymer, and a styrene-ethylene-propylene-styrene block copolymer with an unsaturated carboxylic acid. Of those, a styrene-ethylene-propylene-styrene block copolymer modified with an unsaturated carboxylic acid is preferred. This is because the copolymer exhibits a significant effect when combined with the organic phosphorus-based flame retardant to be described later, and hence both excellent high-speed transmission characteristics (typically a low specific dielectric constant and a low dielectric loss tangent) and excellent flame retardancy can be achieved in an extremely satisfactory manner. The mass ratio of styrene to ethylene and propylene in the styrene-ethylene-propylene-styrene block copolymer is, for example, from 10/90 to 90/10, preferably from 10/90 to 50/50. When the mass ratio falls within such range, an adhesive composition having excellent dielectric characteristics can be obtained.

The weight-average molecular weight Mw of the carboxyl group-containing styrene-based elastomer is preferably from 10,000 to 500,000, more preferably from 30,000 to 300,000, still more preferably from 50,000 to 200,000. When the weight-average molecular weight Mw falls within such range, an excellent adhesive property and excellent dielectric characteristics can be expressed. The term "weight-average molecular weight Mw" as used herein refers to a value obtained by converting a molecular weight measured by gel permeation chromatography (hereinafter sometimes referred to as "GPC") in terms of polystyrene.

The blending amount of the epoxy resin in the resin component is preferably from 1 part by weight to 20 parts by weight, more preferably from 3 parts by weight to 15 parts by weight with respect to 100 parts by weight of the carboxyl group-containing styrene-based elastomer.

The resin component may further contain any other resin in addition to the epoxy resin and the carboxyl group-containing styrene-based elastomer. An example of the other resin includes a thermoplastic resin. Specific examples of the thermoplastic resin include a phenoxy resin, a polyamide resin, a polyester resin, a polycarbonate resin, a polyphenylene oxide resin, a polyurethane resin, a polyacetal resin, a polyethylene-based resin, a polypropylene-based resin, and a polyvinyl-based resin. The kind of the other resin and the blending amount of the other resin in the resin component may each be appropriately set in accordance with purposes and desired characteristics.

The organic phosphorus-based flame retardant is typically a metal phosphinate. Specific examples of the metal phosphinate include aluminum trisdiethylphosphinate, aluminum trismethylethylphosphinate, aluminum trisdiphenylphosphinate, zinc bisdiethylphosphinate, zinc bismethylethylphosphinate, zinc bisdiphenylphosphinate, titanyl bisdiethylphosphinate, titanium tetrakisdiethylphosphinate, titanyl bismethylethylphosphinate, titanium tetrakismethylethylphosphinate, titanyl bisdiphenylphosphinate, and titanium tetrakisdiphenylphosphinate. A blend of the metal phosphinate (e.g., an aluminum salt of an organic phosphinic acid) and melamine polyphosphate may be used. A metal phosphinate-based flame retardant is commercially available. Specific examples of the commercial product include products available under the product names "EXOLIT (registered trademark) OP930", "EXOLIT OP935", "EXOLIT OP1230", "EXOLIT OP1240", and "EXOLIT OP1312" from Clariant Japan.

The blending amount of the organic phosphorus-based flame retardant in the conductive adhesive composition is preferably from 10 parts by weight to 50 parts by weight, more preferably from 15 parts by weight to 40 parts by weight with respect to 100 parts by weight of the total of the epoxy resin and the carboxyl group-containing styrene-based elastomer. When such specific resin component as described above is used, and the organic phosphorus-based flame retardant is blended in such amount, excellent high-speed transmission characteristics can be achieved while excellent flame retardancy is imparted to the shielding film.

Any appropriate conductive filler may be used as the conductive filler. Specific examples of the conductive filler include carbon, silver, copper, nickel, solder, aluminum, a silver-coated copper filler having copper powder plated with silver, and a filler having resin balls or glass beads plated with a metal. Of those, a silver-coated copper filler or nickel is preferred. This is because the silver-coated copper filler or nickel is available at relatively low cost, has excellent conductivity, and has high reliability. Those conductive fillers may be used alone or in combination thereof. Any appropriate shape may be adopted as the shape of the conductive filler in accordance with purposes. Specific examples thereof include a true spherical shape, a flaky shape, a scaly shape, a plate shape, a dendritic shape, an oval shape, a rod shape, a needle shape, and an amorphous shape.

The blending amount of the conductive filler in the conductive adhesive composition is preferably from 10 parts by weight to 80 parts by weight, more preferably from 20 parts by weight to 60 parts by weight with respect to 100 parts by weight of the total of the epoxy resin and the carboxyl group-containing styrene-based elastomer. When the blending amount is excessively large, the adhesive property of a printed wiring board with a ground circuit becomes insufficient and satisfactory transmission characteristics are not obtained in some cases. When the blending amount is excessively small, the conductivity of the composition becomes insufficient and a satisfactory shielding characteristic is not obtained in some cases.

The conductive adhesive composition may further contain any appropriate additive in accordance with purposes. Specific examples of the additive include a tackifier, a polymerization initiator, a curing accelerator, a coupling agent, a thermal age inhibitor, a leveling agent, a defoaming agent, an inorganic filler, a pigment, and a solvent. The number, kinds, and blending amounts of additives to be added may be appropriately set in accordance with purposes and desired characteristics.

The conductive adhesive composition may be cured by any appropriate method. A typical example of the curing method is hot pressing. In the hot pressing, a heating temperature is, for example, from 160° C. to 180° C., a pressing pressure is, for example, from 2 MPa to 5 MPa, and a hot pressing time (curing time) is, for example, from 30 minutes to 60 minutes.

The thickness of the conductive adhesive layer (cured product of the conductive adhesive composition) is preferably from 2 μm to 45 μm, more preferably from 5 μm to 15 μm. With such thickness, both excellent high-speed transmission characteristics and excellent flame retardancy can be achieved in the shielding film to be obtained by a synergistic effect with an effect exhibited by the combination of the specific resin component and the organic phosphorus-based flame retardant, and an effect exhibited by the thickness of the metal layer.

The specific dielectric constant of the conductive adhesive layer at 1 GHz is preferably from 2.0 to 4.0, more preferably from 2.5 to 3.3, still more preferably from 2.7 to 3.0. The dielectric loss tangent of the conductive adhesive layer at 1 GHz is preferably from 0.0015 to 0.0040, more preferably from 0.0015 to 0.0026. The flame retardancy of the conductive adhesive layer is preferably equal to or better than VTM-0. Thus, one achievement of the present invention lies in that an extremely low specific dielectric constant and an extremely low dielectric loss tangent (as a result, extremely excellent high-speed transmission characteristics, in particular, high-frequency transmission characteristics) and excellent flame retardancy have been simultaneously achieved. The foregoing is an unexpected excellent effect that has been obtained only after investigations were performed by trial and error on relationships between: the resin component and flame retardant of the adhesive composition, and the thickness of each layer; and those characteristics.

D. Protective Layer

The protective layer 30 is typically formed of any appropriate resin film. A resin forming the resin film may be a thermosetting resin, a thermoplastic resin, or an electron beam (e.g., visible light or UV light)-curable resin. Specific examples of the resin include an epoxy resin, a phenol resin, an amino resin, an alkyd resin, a urethane resin, a (meth) acrylic resin, a polyimide resin, and a polyamide-imide resin.

The thickness of the protective layer is, for example, from 1 µm to 10 µm.

The shielding film according to the embodiment of the present invention is bonded to a printed wiring board, and is then exposed to a reflow process at high temperature (about 270° C.) Accordingly, constituents each containing a resin in the shielding film, i.e., the protective layer and the conductive adhesive layer are also each required to have such heat resistance as to be capable of resisting the reflow process. In the embodiment of the present invention, each of the protective layer and the conductive adhesive layer has the above-mentioned construction, and hence can satisfy such heat resistance as to be capable of resisting the reflow process. As a result, the entirety of the shielding film of the present invention can satisfy such heat resistance as to be capable of resisting the reflow process.

E. Shielded Printed Wiring Board

A shielded printed wiring board according to an embodiment of the present invention includes a printed wiring board and the shielding film described in the section A to the section D. The printed wiring board has a base film having formed thereon a signal circuit and an insulating film arranged on the entire surface of the base film so as to cover the signal circuit. In one embodiment, the printed wiring board is a flexible printed wiring board. The shielding film is laminated on the insulating film of the printed wiring board through intermediation of the conductive adhesive layer. Detailed description of the construction of the printed wiring board is omitted because the construction is well known in the art.

The present invention is specifically described below by way of Examples. However, the present invention is not limited to these Examples. Evaluation items in Examples are as described below. In Examples, "part (s)" and "%" are by weight unless otherwise specified.

(1) Specific Dielectric Constant and Dielectric Loss Tangent

The specific dielectric constant ($\in$) and dielectric loss tangent (tan δ) of each of cured products of conductive adhesive compositions prepared in Examples, Reference Example, and Comparative Examples were measured with PNA-L Network Analyzer N5230A (manufactured by Agilent Technologies) by a cavity resonator perturbation method (conditions: 23° C., 1 GHz).

(2) Flame Retardancy

Each of the cured products of the conductive adhesive compositions prepared in Examples, Reference Example, and Comparative Examples was evaluated for its flame retardancy by a VTM flammability test in conformity with the UL94 standard.

(3) Characteristic Impedance

The characteristic impedances of shielding films obtained in Example 2 and Reference Example 1 were evaluated with a system including an oscilloscope, a TDR module, and TDR probes. DSC8200 manufactured by Tektronix, Inc. was used as the oscilloscope. 80E04 manufactured by Tektronix, Inc. was used as the TDR module. P8018 (single: 50Ω) and P80318 (differential: 100Ω) manufactured by Tektronix, Inc. were used as the TDR probes.

(4) Eye Pattern

The eye patterns (transmission waveforms) of shielding films obtained in Example 2, Reference Example 1, and Comparative Example 6 were evaluated with a system including a data generator, an oscilloscope, and a sampling module. DSC8200 manufactured by Tektronix, Inc. was used as the oscilloscope. 81133A manufactured by Agilent Technologies was used as the data generator. 80E03 manufactured by Tektronix, Inc. was used as the sampling module. Measurement was performed while a bit rate was changed to 0.5 Gbps, 1.0 Gbps, 2.0 Gbps, and 3.0 Gbps.

EXAMPLE 1

A peelable film having formed thereon a release layer was coated with a resin composition for a protective layer containing an acrylic resin, and the composition was dried to form a protective layer having a thickness of 5 µm. Next, a copper foil having a thickness of 2 µm, which had been produced by rolling, was bonded to the protective layer.

Next, the raw materials as indicated below were added at the ratios as indicated below to a 1,000-milliliter flask with a stirring apparatus, and were stirred under room temperature for 6 hours to be dissolved. Thus, a liquid conductive adhesive composition having a solid content of 20% was prepared. The composition was applied onto the copper foil with a doctor blade (plate-like spatula), and was dried under the conditions of 100° C. and 3 minutes to form a conductive adhesive layer. A cresol novolac-type epoxy resin (manufactured by DIC Corporation, EPICLON N-655-EXP) was used as an epoxy resin. A maleic acid-modified styrene-ethylene-propylene-styrene block copolymer (manufactured by Kuraray Co., Ltd., SEPTON 2007) was used as a carboxyl group-containing elastomer. Aluminum trisdiethylphosphinate (manufactured by Clariant Japan, EXOLIT OP935) was used as an organic phosphorus-based flame retardant. Dendritic silver-coated copper powder (average particle diameter: 13 µm) was used as a conductive filler.

Epoxy resin: 10 parts
Carboxyl group-containing elastomer: 100 parts
Organic phosphorus-based flame retardant: 30 parts
Conductive filler: 20 parts
Imidazole-based curing accelerator (manufactured by Shikoku Chemicals Corporation, CUREZOL C11-Z): 0.2 part by weight
Solvent (toluene/methyl ethyl ketone at a mass ratio of 90:10): 400 parts by weight Thus, a shielding film having a construction "metal layer/conductive adhesive layer" was produced. The resultant shielding film was subjected to the evaluations (1) and (2). The results are shown in Table 1.

EXAMPLE 2

Figure 2:
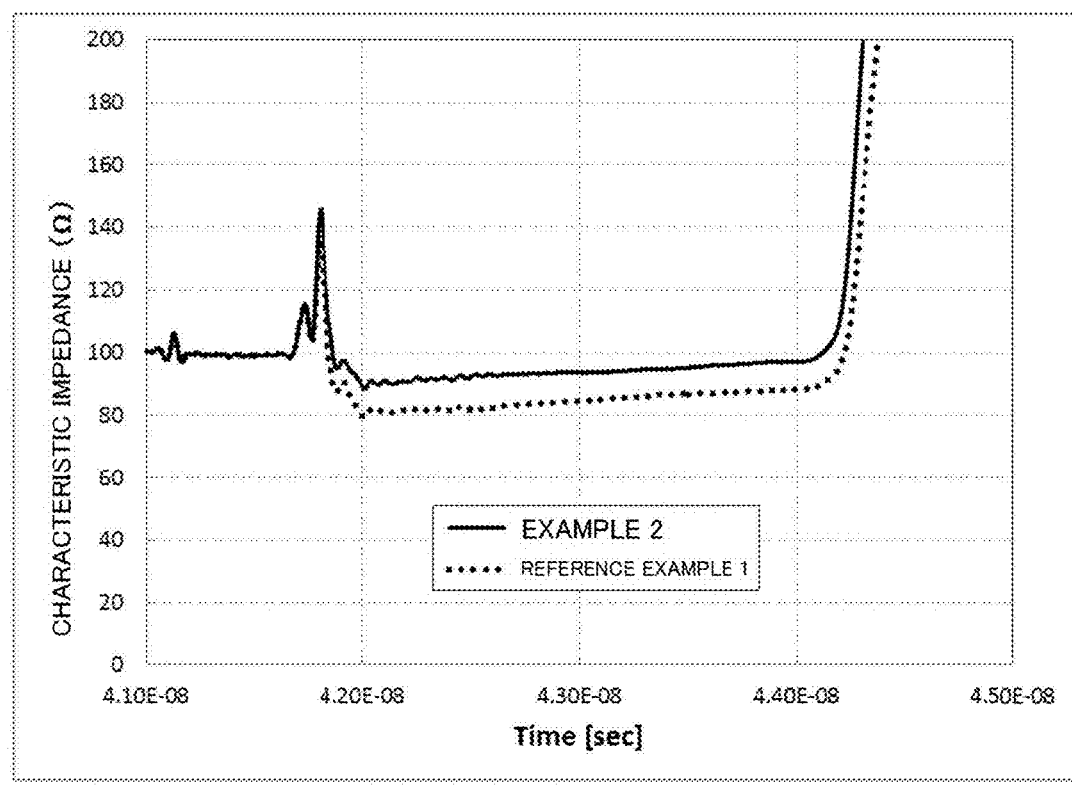
FIG. 2 is a graph for showing comparison between the characteristic impedances of the shielding films of Example 2 and Reference Example 1.
Figure 3:
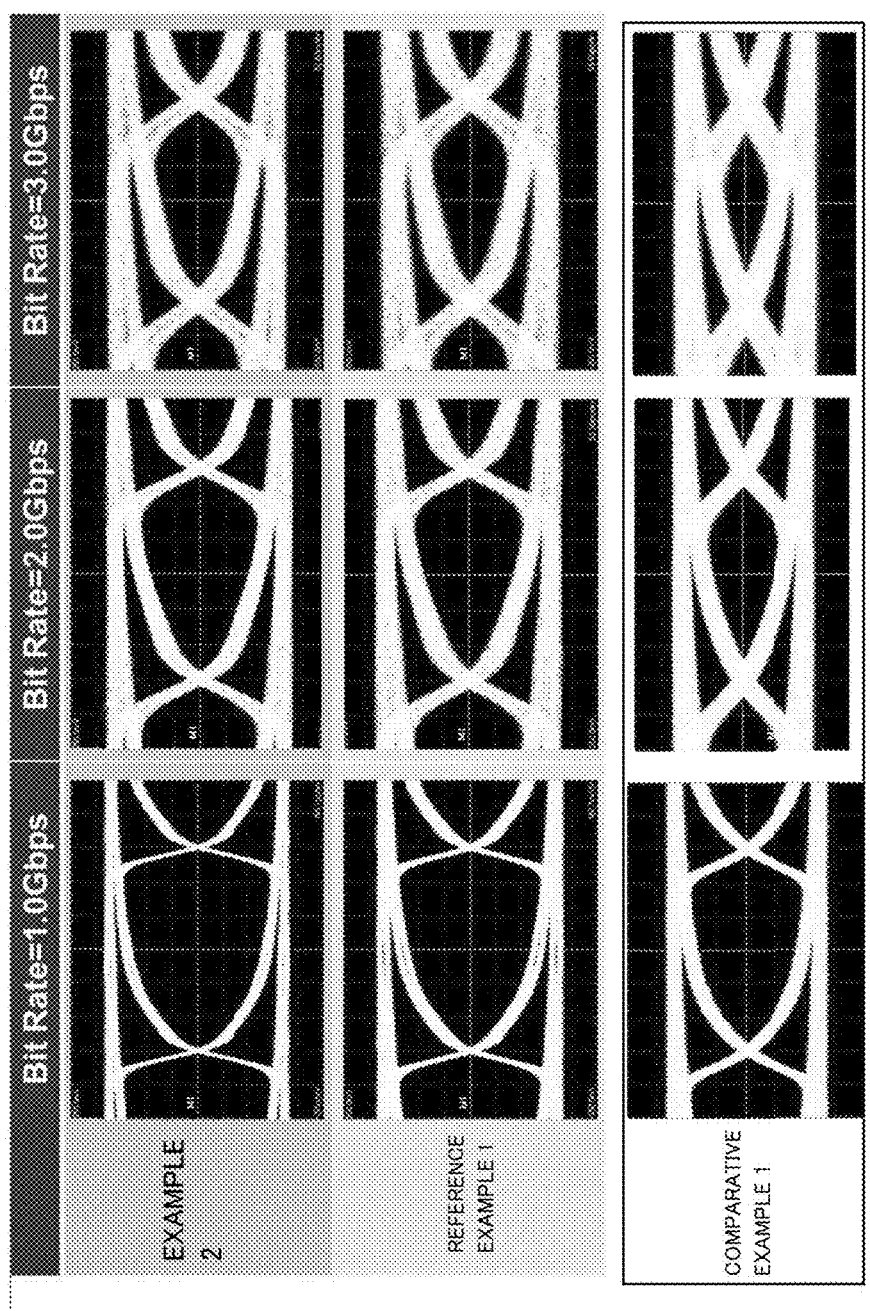
FIG. 3 is an image for showing comparison among the eye patterns of the shielding films of Example 2, Reference Example 1, and Comparative Example 6.

A shielding film was obtained in the same manner as in Example 1 except that a copper foil having a thickness of 5.5 µm was used. The resultant shielding film was subjected to the evaluations (1) to (4). The results of its specific dielectric constant, dielectric loss tangent, and flame retardancy are shown in Table 1. The result of its characteristic impedance is shown in FIG. 2 together with the result of Reference Example 1. The result of its eye pattern is shown in FIG. 3 together with the results of Reference Example 1 and Comparative Example 6.

EXAMPLE 3

A shielding film was obtained in the same manner as in Example 2 except that the addition amount of the organic phosphorus-based flame retardant was changed as shown in Table 1. The resultant shielding film was subjected to the evaluations (1) to (4). The results of its specific dielectric constant, dielectric loss tangent, and flame retardancy are shown in Table 1.

EXAMPLE 4

A shielding film was obtained in the same manner as in Example 2 except that the addition amount of the organic phosphorus-based flame retardant was changed as shown in Table 1. The resultant shielding film was subjected to the evaluations (1) to (4). The results of its specific dielectric constant, dielectric loss tangent, and flame retardancy are shown in Table 1.

EXAMPLE 5

A shielding film was obtained in the same manner as in Example 2 except that the addition amounts of the organic phosphorus-based flame retardant and the conductive filler were changed as shown in Table 1. The resultant shielding film was subjected to the evaluations (1) to (4). The results of its specific dielectric constant, dielectric loss tangent, and flame retardancy are shown in Table 1.

REFERENCE EXAMPLE 1

A shielding film was obtained in the same manner as in Example 2 except that the flame retardant was not used. The resultant shielding film was subjected to the evaluations (1) to (4). The results of its specific dielectric constant, dielectric loss tangent, and flame retardancy are shown in Table 1. The result of its characteristic impedance is shown in FIG. 2 together with the result of Example 2. The result of its eye pattern is shown in FIG. 3 together with the results of Example 2 and Comparative Example 6.

COMPARATIVE EXAMPLE 1

A shielding film was obtained in the same manner as in Example 2 except that 30 parts of a nitrogen-based flame retardant (melamine cyanurate, manufactured by Nissan Chemical Industries, Ltd., MC-4500) was used instead of 30 parts of the organic phosphorus-based flame retardant. The resultant shielding film was subjected to the evaluations (1) and (2). The results are shown in Table 1.

COMPARATIVE EXAMPLE 2

A shielding film was obtained in the same manner as in Example 2 except that a modified epoxy resin (acrylic-modified epoxy resin, manufactured by Nippon Kayaku Co., Ltd., ZCR-1798H) was used as a resin component. The resultant shielding film was subjected to the evaluations (1) and (2). The results are shown in Table 1.

COMPARATIVE EXAMPLE 3

A shielding film was obtained in the same manner as in Example 1 except that: silver was deposited to form a metal layer (thickness: 0.1 μm); a phosphorus-containing epoxy resin (manufactured by Nippon Steel Chemical Co., Ltd., FX-305BEK) was used as a resin component; the thickness of a conductive adhesive layer was set to 10 μm; and a nitrogen-based flame retardant was used. The resultant shielding film was subjected to the evaluations (1) and (2). The results are shown in Table 1.

COMPARATIVE EXAMPLE 4

A shielding film was obtained in the same manner as in Example 2 except that the addition amount of the organic phosphorus-based flame retardant was changed as shown in Table 1. The resultant shielding film was subjected to the evaluations (1) to (4). The results of its specific dielectric constant, dielectric loss tangent, and flame retardancy are shown in Table 1.

COMPARATIVE EXAMPLE 5

A shielding film was obtained in the same manner as in Example 2 except that the addition amount of the organic phosphorus-based flame retardant was changed as shown in Table 1. The resultant shielding film was subjected to the evaluations (1) to (4). The results of its specific dielectric constant, dielectric loss tangent, and flame retardancy are shown in Table 1.

COMPARATIVE EXAMPLE 6

A shielding film was obtained in the same manner as in Example 2 except that the addition amounts of the organic phosphorus-based flame retardant and the conductive filler were changed as shown in Table 1. The resultant shielding film was subjected to the evaluations (1) to (4). The results of its specific dielectric constant, dielectric loss tangent, and flame retardancy are shown in Table 1. The result of its eye pattern is shown in FIG. 3 together with the results of Example 2 and Reference Example 1.

TABLE 1

| | | Example 1 | Example 2 | Example 3 | Example 4 | Example 5 | Reference Example 1 | Comparative Example 1 |
|---|---|---|---|---|---|---|---|---|
| Metal layer | Thickness (μm) | 2 | 5.5 | 5.5 | 5.5 | 5.5 | 5.5 | 5.5 |
| | Material | Copper foil | Copper foil | Copper foil | Copper foil | Copper foil | Copper foil | Copper foil |
| Conductive adhesive layer | Thickness (μm) | 9 | 9 | 9 | 9 | 9 | 9 | 9 |
| | Resin component | Low dielectric | Low dielectric | Low dielectric | Low dielectric | Low dielectric | Low dielectric | Low dielectric |
| | Flame retardant | Organic phosphorus-based | Organic phosphorus-based | Organic phosphorus-based | Organic phosphorus-based | Organic phosphorus-based | — | Nitrogen-based |
| | Addition amount of flame retardant (part(s)) | 30 | 30 | 15 | 40 | 40 | — | 30 |

TABLE 1-continued

|  |  |  |  |  |  |  |  |  |
|---|---|---|---|---|---|---|---|---|
|  | Conductive filler (part(s)) | 20 | 20 | 20 | 20 | 60 | 20 | 20 |
| Characteristic | Specifie dielectric constant | 2.76 | 2.82 | 2.68 | 3.11 | 3.58 | 3.00 | 4.50 |
|  | Dielectric loss tangent | 0.0020 | 0.0020 | 0.0019 | 0.0030 | 0.0036 | 0.0026 | 0.0150 |
|  | Flame retardancy | VTM-0 | VTM-0 | VTM-0 | VTM-0 | VTM-0 | NG | VTM-0 |

|  |  |  | Comparative Example 2 | Comparative Example 3 | Comparative Example 4 | Comparative Example 5 | Comparative Example 6 |
|---|---|---|---|---|---|---|---|
| Metal layer | Thickness (μm) |  | 5.5 | 0.1 | 5.5 | 5.5 | 5.5 |
|  | Material |  | Copper foil | Silver deposited layer | Copper foil | Copper foil | Copper foil |
| Conductive adhesive layer | Thickness (μm) |  | 9 | 10 | 9 | 9 | 9 |
|  | Resin component |  | Modified | Phosphorus-containing | Low dielectric | Low dielectric | Low dielectric |
|  | Flame retardant |  | Organic phosphorus-based | Nitrogen-based | Organic phosphorus-based | Organic phosphorus-based | Organic phosphorus-based |
|  | Addition amount of flame retardant (part(s)) |  | 30 | 30 | 5 | 60 | 40 |
|  | Conductive filler (part(s)) |  | 20 | 20 | 20 | 20 | 150 |
| Characteristic | Specifie dielectric constant |  | 5.10 | 5.50 | 2.56 | 4.20 | 4.50 |
|  | Dielectric loss tangent |  | 0.0170 | 0.0280 | 0.0019 | 0.0140 | 0.0240 |
|  | Flame retardancy |  | VTM-0 | V-0 | NG | VTM-0 | VTM-0 |

*The unit of a thickness is μm.
*The "low dielectric" resin component contains the epoxy resin and the carboxyl group-containing elastomer.
*The term "phosphorus-containing" refers to the phosphorus-containing epoxy resin and the term "modified" refers to the acrylic-modified epoxy resin.

<Evaluation>

As is apparent from Table 1, when a specific resin component, a specific amount of an organic phosphorus-based flame retardant, and a specific amount of a conductive filler are used in combination in the conductive adhesive layer of a shielding film, an extremely low specific dielectric constant and an extremely low dielectric loss tangent (i.e., excellent high-speed transmission characteristics) can be achieved while excellent flame retardancy is imparted to the shielding film. In addition, as shown in FIG. 2, the shielding film of Example 2 is found to show an impedance change smaller than that of the shielding film of Reference Example 1. Further, as shown in FIG. 3, the shielding film of Example 2 is found to be superior in eye pattern to the shielding films of Reference Example 1 and Comparative Example 6 (the superiority becomes particularly significant as the bit rate increases). That is, the following is clearly shown in FIG. 2 and FIG. 3: the addition of the organic phosphorus-based flame retardant to the specific resin component in the conductive adhesive layer of the shielding film significantly improves not only the flame retardancy of the shielding film but also the transmission characteristics thereof. The foregoing is an unexpected excellent effect exhibited by the combination of the specific resin component and the organic phosphorus-based flame retardant.

INDUSTRIAL APPLICABILITY

The shielding film according to the embodiment of the present invention can be suitably used as the electromagnetic shielding film of a printed wiring board.

REFERENCE SIGNS LIST 10 metal layer
20 conductive adhesive layer
30 protective layer
40 release film
100 shielding film

The invention claimed is:

1. A shielding film, comprising:
a metal layer; and
a conductive adhesive layer arranged on one side of the metal layer,
wherein:
the conductive adhesive layer contains a cured product of an epoxy resin and a carboxyl group-containing elastomer, an organic phosphorus-based flame retardant, and a conductive filler;
the metal layer has a thickness of from 0.3 μm to 7 μm; and
a conductive adhesive forming the conductive adhesive layer contains 10 parts by weight to 50 parts by weight of the organic phosphorus-based flame retardant and 10 parts by weight to 80 parts by weight of the conductive filler with respect to 100 parts by weight of a total of the epoxy resin and the carboxyl group-containing elastomer.

2. The shielding film according to claim 1, wherein the carboxyl group-containing elastomer comprises a styrene-ethylene-propylene-styrene copolymer modified with an unsaturated carboxylic acid.

3. The shielding film according to claim 1, wherein the organic phosphorus-based flame retardant comprises a metal phosphinate.

4. The shielding film according to claim 1, wherein the conductive adhesive layer has flame retardancy equal to or better than VTM-0, and has a dielectric constant of from 2.0 to 4.0 and a dielectric loss tangent of from 0.0015 to 0.0040 at 1 GHz.

5. A shielded printed wiring board, comprising:
a printed wiring board; and
a shielding film in accordance with claim 1 disposed thereon.

6. A shielding film, comprising:
a metal layer; and
a conductive adhesive layer arranged on one side of the metal layer,
wherein the conductive adhesive layer contains a cured product of an epoxy resin and a carboxyl group-containing elastomer, an organic phosphorus-based flame retardant, and a conductive filler; the metal layer has a thickness of from 0.3 µm to 7 µm; and a conductive adhesive forming the conductive adhesive layer contains 10 parts by weight to 50 parts by weight of the organic phosphorus-based flame retardant and 10 parts by weight to 80 parts by weight of the conductive filler with respect to 100 parts by weight of a total of the epoxy resin and the carboxyl group-containing elastomer;
wherein the carboxyl group-containing elastomer comprises a styrene-ethylene-propylene-styrene copolymer modified with an unsaturated carboxylic acid;
wherein the organic phosphorus-based flame retardant comprises a metal phosphinate; and
wherein the conductive adhesive layer has flame retardancy equal to or better than VTM-0, and has a dielectric constant of from 2.0 to 4.0 and a dielectric loss tangent of from 0.0015 to 0.0040 at 1 GHz.

* * * * *